United States Patent [19]
Olafsson

[11] Patent Number: 5,768,309
[45] Date of Patent: Jun. 16, 1998

[54] UNIFIED TRELLIS ENCODER

[75] Inventor: Sverrir Olafsson, Seltjarnarnes, Iceland

[73] Assignee: Rockwell International Corporation, Newport Beach, Calif.

[21] Appl. No.: 327,079

[22] Filed: Oct. 21, 1994

[51] Int. Cl.$^6$ .............................. H04B 1/38; H03M 13/00
[52] U.S. Cl. .................... 375/221; 375/265; 375/296; 375/341; 375/346; 371/30; 371/41; 371/434
[58] Field of Search .................... 375/219, 216, 375/221, 222, 265, 285, 288, 295, 296, 316, 341, 358, 346; 371/37.4, 41, 42, 69.1, 30, 43

[56] References Cited

U.S. PATENT DOCUMENTS

| | | | |
|---|---|---|---|
| 4,701,923 | 10/1987 | Fukasawa et al. | 371/41 |
| 4,797,898 | 1/1989 | Martinez | 375/222 |

*Primary Examiner*—Stephen Chin
*Assistant Examiner*—Amanda T. Le
*Attorney, Agent, or Firm*—William C. Cray; Philip K. Yu

[57] ABSTRACT

A method of digital data transmission between a first transceiver and a second transceiver is disclosed. The first transceiver has a first transmitter and a first receiver and the second transceiver has a second transmitter and a second receiver. The first transmitter also contains a programmable encoder for encoding its transmission, while the second receiver uses at least one of a plurality of error correcting codes (ECC's) for decoding its reception. Each ECC can be specified by a predetermined set of parameters. The method comprises the steps of: establishing connection between the first and second transceivers; the second receiver selecting which one of the plurality of ECC's for transmission by the first transmitter, each of the plurality of ECC's capable of being represented by at least one method of implementation described by a sequence of state transitions; the second receiver generating a corresponding set of parameters based on the ECC selected; the second receiver communicating the parameters to the first transmitter; the first transmitter inserting the parameters in its programmable encoder to generate the ECC to encode the digital data for transmission; the first transmitter transmitting the encoded digital data to the second receiver, and the receiver decoding the encoded digital data based on the ECC.

11 Claims, 4 Drawing Sheets

UNIFIED TRELLIS ENCODER

ART BACKGROUND

The present invention relates to communication devices for transmission of digital data and more specifically to high-speed modems and their modulation methodology.

In many digital communication systems, error correction coding is used to reduce the number of transmission errors. In most cases, the coding is simple in the transmitter, even for very complex codes. The decoder in the receiver, on the other hand, can be quite expensive in terms of resources such as memory and processing load. Therefore, selecting a proper error correction code must balance the coding gain of the code with the available resources in the receiver. As technology advances, receivers can implement more complex codes with higher coding gains, both because of the lowering cost of resources as well as with the discovery of new codes and decoding techniques. However, unless the remote transmitter is changed, the receiver cannot take advantage of these better codes.

The present invention describes a method of a receiver determining which error correction code to use, then sending the relevant parameters of the code to a transmitter which is equipped with a generic procedure to implement a wide variety of codes. Thus a transmitter need not be changed to allow for use of better codes. A receiver, based on its resources, can make a determination of which code to use independent of the transmitter.

Further, in cases where a transmitter is required to implement more than one code, such as in V.34 modems implementation may be simplified by using the general procedure described. This lowers complexity and increases flexibility.

SUMMARY OF THE PRESENT INVENTION

In the following description, such a structure is disclosed. With the exchange of a reasonable amount of data, a receiver can send a code's parameters to the remote transmitter, which in a simple manner can insert them in its general encoder. Thus selection of trellis codes is entirely up to each receiver, and is not limited to a small number of known codes of currently accepted complexity. Advantage can be taken of future advances in hardware platforms, in order to continually improve performance of transmission systems, and not limit it to the state of current technology.

A method of digital data transmission between a first transceiver and a second transceiver is disclosed. The first transceiver has a first transmitter and a first receiver and the second transceiver has a second transmitter and a second receiver. The first transmitter also contains a programmable encoder for encoding its transmission, while the second receiver uses at least one of a plurality of error correcting codes (ECC's) for decoding its reception. Each ECC can be specified by a predetermined set of parameters.

The method comprises the steps of: establishing connection between the first and second transceivers; the second receiver selecting which one of the plurality of ECC's for transmission by the first transmitter, each of the plurality of ECC's capable of being represented by at least one method of implementation described by a sequence of state transitions; the second receiver generating a corresponding set of parameters based on the ECC selected; the second receiver communicating the parameters to the first transmitter; the first transmitter inserting the parameters in its programmable encoder to generate the ECC to encode the digital data for transmission; the first transmitter transmitting the encoded digital data to the second receiver, and the receiver decoding the encoded digital data based on the ECC.

BRIEF DESCRIPTION OF THE DRAWINGS

Additional objects, features and advantages of the present invention will become apparent in the following description, wherein.

DETAILED DESCRIPTION OF THE PREFERRED EMBODIMENT

Figure 1:
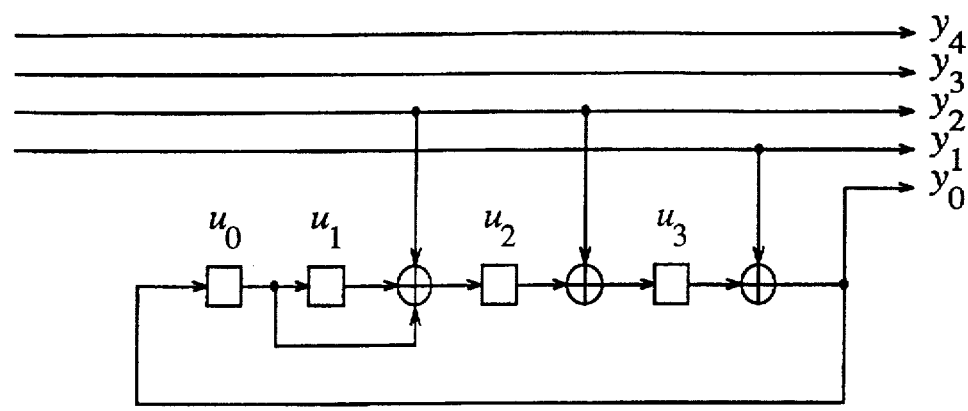
FIG. 1 shows one implementation of 16-state Wei code to be utilized in connection with the present invention.

A unified trellis encoder for transmission systems encoding is disclosed. The transmitter includes a general procedure to produce a data signal, based on parameters specified by the receiver. The actual parameters are thus only receiver-dependent. They would normally be exchanged during a startup procedure The complexity of implementation in a transmitter of this unified scheme is comparable to that of implementing 2 or 3 predetermined codes, yet it allows implementation of codes with unlimited complexity. It thereby eliminates the need to specify certain codes to use in a communication system, and allows progression of complexity as receiver technology advances.

The trellis encoder is now described as follows. It is well known that linear codes can be defined in terms of matrices, where the state transitions of the code can be expressed as:

$$u(m+1) = C \cdot u(m) + D \cdot y(m),$$

where $u(m) = [u_0(m), u_1(m), \ldots, u_{s-1}(m)]^T$ is a vector representing the code state. C and D are matrices specifying the code, and $y(m) = [y_1(m), y_2(m), \ldots, y_r(m)]^T$ is a vector representing the input data, and the arithmetic is standard binary matrix arithmetic. This representation can easily be extended to codes with nonlinear elements.

First of all, let us concatenate C with D, and combine u and y into a single vector v and assume a maximum of 64-states and 4 data inputs. Then we have the simple equation:

$$u(m+1) = C \cdot v(m)$$

where:

$$C = \begin{bmatrix} c_{00} & c_{01} & \cdots & c_{09} \\ c_{10} & \cdot & & \cdot \\ \cdot & & & \cdot \\ \cdot & & & \cdot \\ c_{50} & \cdots & & c_{59} \end{bmatrix}$$

$$v(m) = [u_0(m), u_1(m), u_2(m), u_3(m), u_4(m), u_5(m), y_1(m), y_2(m), y_3(m), y_4(m)]^T$$

This can be used to specify all codes without nonlinear elements with up to 64 states.

To include codes with nonlinear elements, we first need to specify the inputs to the nonlinear elements. This can be done simply by adding rows to the matrix C, and now calculating an intermediate vector w:

$$w(m) = C \cdot v(m)$$

Assuming 2 AND gates, 4 rows would be added to C to specify the gate inputs (C then becoming a 10×10 matrix). The gate outputs can then be calculated individually from the elements of w. These outputs then add to the other elements of w to give the new state vector u.

For codes with more than 64 states, one need only add more rows and columns for the state variables, and additional data inputs as appropriate, and it appears that 2 nonlinearities 115 (AND gates) are sufficient to achieve the proper rotational invariance for most codes of interest. In the case of 4 data inputs and 2 multipliers, a 256-state code would require a 12×12 matrix, a 1024-state code a 14×14 matrix, and a 4096-state code a 16×16 matrix. In terms of transmitter complexity, the cost of implementing the largest codes is rather insignificant as it grows logarithmically with the number of states, whereas the receiver's decoder complexity will grow at least linearly.

The Method in General Application

The trellis encoder for a given number of states $2^{156\ S}$ can be completely specified via the matrix C and the following operations, where $u(m) = [u_0(m), u_1(m), \ldots, u_{s-1}(m)]^T$ is the state vector, and $y(m) = [y_1(m), y_2(m), \ldots, y_r(m)]^T$ is the data input vector:

$$w_k(m) = \sum_{i=0}^{s+r-1} c_{ki} \cdot v_i(m), \text{ for } k = 0, 1, \ldots, s + 2t - 1$$

where:

$$u_k(m + 1) =$$

$$\begin{cases} w_k(m) + w_{s+2k}(m) \cdot w_{s+2k+1}(m) & \text{for } k = 0, 1, \ldots, t - 1 \\ w_k(m) & \text{for } k = t, t+1, \ldots, s + 2t - 1 \end{cases}$$

$$C = \begin{bmatrix} c_{00} & c_{01} & \cdots & c_{0(s+r-1)} \\ c_{10} & \cdot & & \cdot \\ \cdot & & & \cdot \\ \cdot & & & \cdot \\ \cdot & & & \cdot \\ c_{(s+2t-1)0} & \cdots & & c_{(s+2t-1)(s+r-1)} \end{bmatrix}$$

$$v(m) = [u_0(m), u_1(m), \ldots, u_{s-1}(m), y_1(m), y_2(m), \ldots, y_r(m)]^T$$

The unified trellis encoder method could also be described in the following. The receiver first makes a determination which code to use (this can be either a fixed code for that receiver, or a decision can be made adaptively based on available resources). The selection of the code by the receiver can be based on predetermined criteria, which comprise predetermined line characteristics of the connection between the receiver and the transmitter. The receiver generates the relevant information that would enable the transmitter to use the code.

The receiver then conveys that information to the transmitter in a predetermined manner. The transmitter, upon receiving the information from the receiver, inserts that information in its generic procedure, which then produces the code the receiver intends to decode.

More specifically, the receiver's relevant information may be contained in a binary (s+2t) by (s+r) matrix C, and the generic procedure may be as follows, where the input to the procedure is a data input vector y with r elements and the output is a state vector u with s elements.

The transmitter generates a vector v with (s+r) elements as the concatenation of the state vector u and the data input vector y.

The transmitter multiplies the matrix C with the vector v, to generate a vector w.

The transmitter generates the new state vector u by copying the first s elements of w, then multiplying every two adjacent elements of the 2t that remain with each other and adding the results in order to the first t elements of u to produce the new state vector. The new state vector then determines the transmitted output signal.

Specifically, if the codes are restricted to by systematic with z bits of redundancy, any z bits of the output state can be used to augment the input data bits.

The arithmetic used would normally be binary arithmetic defined as follows:

0+0=0, 0+1=1, 1+0=1, 1+1=0, 0*0=0, 0*1=0, 1*0=0, 1*1=1.

However, this can clearly be extended to any preferred numeric base using regular coding theory by those skilled in the art.

If the codes used are restricted to be linear, the direct relation of u(m) to u(m+1) 175 can be inferred, as will be understood by those skilled in the art, and no linear elements are necessary. For instance, those skilled in the art may define:

$$u_k(m + 1) = u_{k-1}(m) + \sum_{i=0}^{r-1} c_{k,s+i} \cdot y_i(m) \qquad \text{for } k = 1, 2, \ldots s - 1$$

$$u_0(m + 1) = u_{s-1}(m) + \sum_{i=0}^{r-1} c_{k,s+i} \cdot y_i(m)$$

Then the code is completely described with the first "s" rows and the last "r" columns of the matrix, and only that information needs to be exchanged.

In cases where a transmitter must implement multiple fixed codes, the procedure described above can be used to simplify implementation. The transmitter would use the same general procedure, whereas it would then store one matrix for each code, rather than having program subroutines for each code. Having determined which code to use, it would insert the appropriate matrix in the general procedure.

EXAMPLES

The following are some of the exemplary implementations for various codes currently in use in industry:

1. For example, the 16-state Wei code shown in FIG. 1 would be given by:

$$C_{Wei16} = \begin{bmatrix} 0 & 0 & 0 & 1 & 1 & 0 & 0 & 0 \\ 1 & 0 & 0 & 0 & 0 & 0 & 0 & 0 \\ 1 & 1 & 0 & 0 & 0 & 1 & 0 & 0 \\ 0 & 0 & 1 & 0 & 0 & 1 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}$$

or more compactly using hexadecimal notation as:

$$C_{Wei16} = \{6, 4, 8, 1, 1, C, 0, 0\}$$

Figure 2:
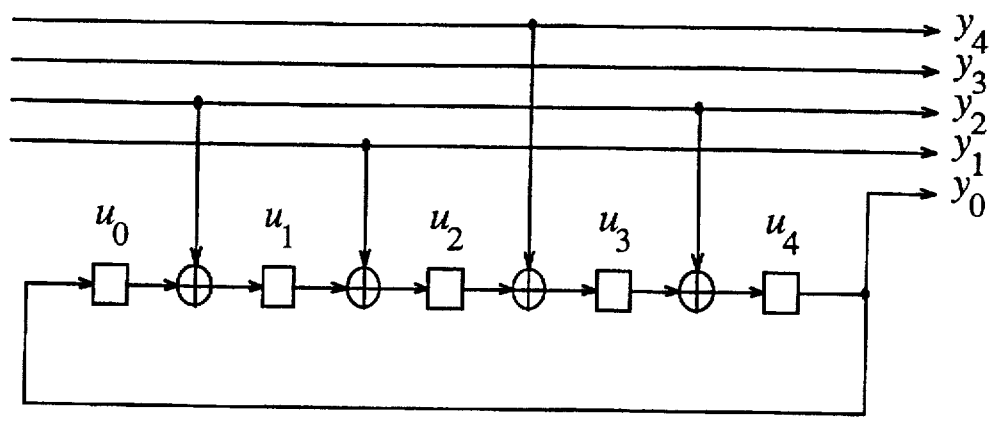
FIG. 2 shows one implementation of 32-state Williams code to be utilized in connection with the present invention.

2. The 32-state Williams code shown in FIG. 2 would similarly be given by:

$$C_{Williams32} = \{2, 4, 8, 10, 1, 4, 12, 0, 8\}.$$

Figure 3:
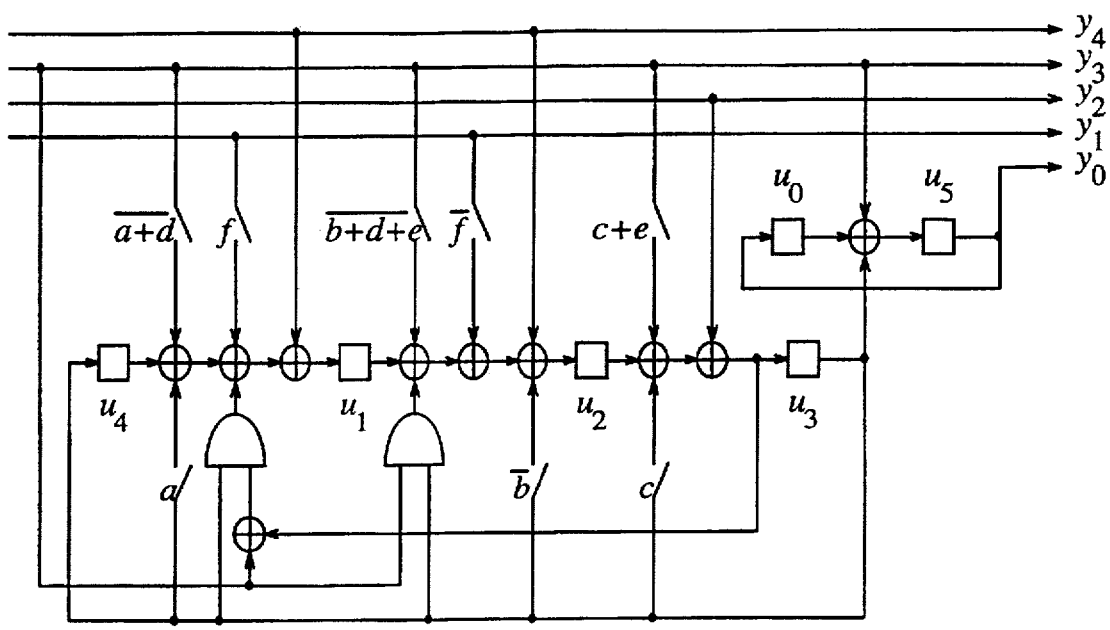
FIG. 3 shows one implementation of 64-state Trott-Sarvis codes to be utilized in connection with the present invention.

3. The Trott-Sarvis family of 64-state codes as shown in FIG. 3 would be given by:

$$C_{Trott-Sarvis} = \begin{bmatrix} 0 & 0 & 0 & 0 & 0 & 1 & 0 & 0 & 0 & 0 \\ 0 & 0 & 0 & 0 & 1 & 0 & f & 0 & \overline{a+d} & 0 \\ 0 & 1 & 0 & 0 & 0 & 0 & f & 0 & \overline{b+d+e} & 1 \\ 0 & 0 & 1 & 0 & 0 & 0 & 0 & 1 & c+e & 0 \\ 0 & 0 & 0 & 1 & 0 & 0 & 0 & 0 & 0 & 0 \\ 1 & 0 & 0 & 1 & 0 & 0 & 0 & 0 & 0 & 0 \\ 0 & 0 & 1 & c & 0 & 0 & 0 & 1 & \overline{c+e} & 0 \\ 0 & 0 & 0 & 1 & 0 & 0 & 0 & 0 & 0 & 0 \\ 0 & 0 & 0 & 0 & 0 & 0 & 0 & 0 & 1 & 0 \\ 0 & 0 & 0 & 1 & 0 & 0 & 0 & 0 & 0 & 0 \end{bmatrix}$$

Figure 4:
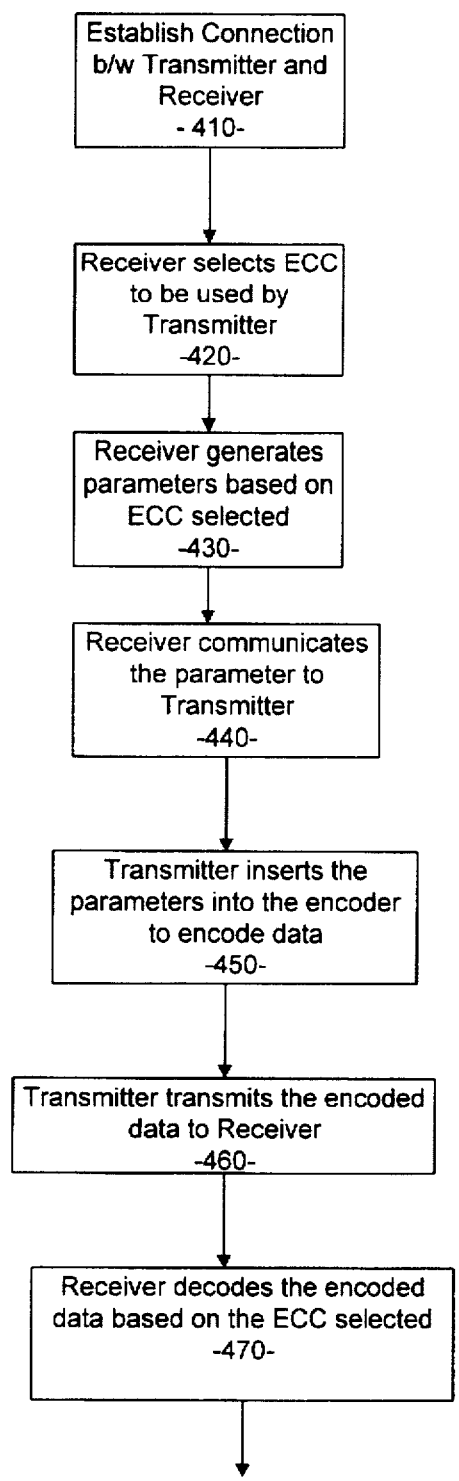
FIG. 4 shows a flow chart of one aspect of the present invention.

FIG. 4 shows a flow chart of one aspect of the present invention. In Step 410, connection is established between a transmitter and a receiver. The receiver then selects the error correction coding and generates the parameters associated with the ECC to be used by the transmitter. (420, 430) The receiver then communicates the parameter to the transmitter (440), where the transmitter inserts the parameters in its encoder for encoding the data. (450) After encoding, the encoded data is transmitted to the receiver, which decodes the encoded data based on the ECC selected. (460, 470).

The following C-code gives an example of the implementation and shows the simplicity of the method in accordance with the present invention: When this method is implemented, it is usually convenient to express the matrix as a vector of hexadecimal numbers, where each hexadecimal number corresponds to either a row or a column of the matrix. Multiple binary operations can then be carried out in single hexadecimal operations. The following example combines the columns to hexadecimal numbers. It would be apparent to those skilled in the art to construct an implementation by combining the rows as well:

```
/* Universal Trellis Encoder
** The trellis code is defined by the vector C[i], where
** each element represents a column of the matrix.
** The number of states is given by 2^s, the input
** state is U, and the input data is in Y.
** The return value is the new state, with the encoder
** output y0 as its least-significant bit.
*/
int C[16];
int trellis_encoder(int s, int t, int r, int U, int Y)
{ int mask,NewU,m1,m2;
    V=U+(Y<<s); /* combine state and input data */
    NewU=0; mask=1; /* initialize new state and mask*/
    for (i=0;i<s+r;i++)
    { if ( V&mask ) NewU ^= C[i]; /* XOR in columns */
        mask<<=1; /* shift up mask */
    }
    m1=1; m2=3<<s; /*initialize masks for ANDing*/
    for (i=0;i<t;i++)
    {if NewU&m2==m2)NewU^=m1 /*do AND and add*/
    m2<<=2; m1<<=1; /*shift up masks*/
    }
    return(NewU&((1<<s)-1));
}
```

I claim:

1. A method of digital data transmission in a channel between a first transceiver and a second transceiver, said first transceiver comprising a first transmitter and a first receiver, said second transceiver comprising a second transmitter and a second receiver, said first transmitter comprising a programmable encoder for encoding its transmission, said second receiver using at least one of a plurality of convolutional error correcting codes (ECC's) for decoding its reception, each ECC being specified by a predetermined set of parameters, said method comprising:

establishing connection between said first and second transceivers;

said second receiver selecting, based on predetermined criteria, which one of said plurality of ECC's for transmission by said first transmitter, each of said plurality of ECC's capable of being represented by at least one method of implementation described by a sequence of state transitions;

said second receiver generating a corresponding set of parameters based on the ECC selected said second receiver communicating said parameters to said first transmitter;

said first transmitter inserting said parameters in its programmable encoder to generate said selectable error correcting code to encode said digital data for transmission;

said first transmitter transmitting the encoded digital data to said second receiver, and said receiver decoding said encoded digital data based on said selected error correcting code.

2. A method according to claim 1, wherein said plurality of ECC's comprise trellis codes for V.32 and V.34 modems as specified by Recommendations V.32 and V.34 of the International Telecommunication Union-Telecommunication Standardization Sector ("ITU-TSS").

3. A method according to claim 1, wherein said second receiver selects one of said ECC's based on predetermined criteria comprising predetermined line characteristics of the connection between said first and second transceivers.

4. A method according to claim 3, wherein said corresponding set of parameters is contained in a binary matrix C of (s+2t) by (s+r), wherein "s" is such that $2^s$ is the number of states of the error correcting code which uses "s" binary state variables "t" is the number of binary multiplies in the code implementation "r" is the number of binary data inputs to the encoder and the elements of C, indexed as "$c_{ij}$", are given by the formula describing transitions of state variables "$u_k$", as follows:

$$w_k(m) = \sum_{i=0}^{s+r-1} c_{k,i} \cdot v_i(m), \text{ for } k = 0,1,\ldots,s+2t-1$$

where:

$u_k(m+1) =$ $$\begin{cases} w_k(m) + w_{s+2k}(m) \cdot w_{s+2k+1}(m) & \text{for } k = 0,1,\ldots,t-1 \\ w_k(m) & \text{for } k = t, t+1,\ldots,s+2t-1 \end{cases}$$

-continued $$C = \begin{bmatrix} c_{00} & c_{01} & \cdots & c_{0(s+r-1)} \\ c_{10} & & \cdot & \\ & & \cdot & \\ & & \cdot & \\ & & \cdot & \\ c_{(s+2t-1)0} & \cdots & & c_{(s+2t-1)(s+r-1)} \end{bmatrix}$$

$v(m) = [u_0(m), u_1(m), \ldots, u_{s-1}(m), y_1(m), y_2(m), \ldots, y_r(m)]^T$ such that these state transitions correspond to said method of implementation of the error correcting code.

5. A method according to claim 4, wherein said programmable encoder accepts the matrix C and generates said sequence of state transitions and consequently generates output data for transmission in a predetermined way.

6. A method according to claim 1, wherein said corresponding set of parameters is contained in a binary matrix C of (s+2t) by (s+r), wherein "s" is such that $2^s$ is the number of states of the error correcting code which uses "s" binary state variables, "t" is the number of binary multiplies in the code implementation, "r" is the number of binary data inputs to the encoder, and the elements of C, indexed as "$c_{ij}$", are given by the formula describing transitions of state variables "$u_k$", as follows:

$$w_k(m) = \sum_{i=0}^{s+r-1} c_{ki} \cdot v_i(m), \text{ for } k = 0, 1, \ldots, s+2t-1$$

where:

$u_k(m + 1) =$ $$\begin{cases} w_k(m) + w_{s+2k}(m) \cdot w_{s+2k+1}(m) & \text{for } k = 0, 1, \ldots, t-1 \\ w_k(m) & \text{for } k = t, t+1, \ldots, s+2t-1 \end{cases}$$

$$C = \begin{bmatrix} c_{00} & c_{01} & \cdots & c_{0(s+r-1)} \\ c_{10} & & \cdot & \\ & & \cdot & \\ & & \cdot & \\ & & \cdot & \\ c_{(s+2t-1)0} & \cdots & & c_{(s+2t-1)(s+r-1)} \end{bmatrix}$$

$v(m) = [u_0(m), u_1(m), \ldots, u_{s-1}(m), y_1(m), y_2(m), \ldots, y_r(m)]^T$ such that these state transitions correspond to said method of implementation of the error correcting code.

7. A method according to claim 6, wherein said programmable encoder accepts the matrix C and generates said sequence of state transitions and consequently generates output data for transmission in a predetermined way.

8. A method of digital data transmission through a channel between a first transceiver and a second transceiver, said first transceiver comprising a first transmitter and a first receiver, said second transceiver comprising a second transmitter and a second receiver, said first transmitter comprising a programmable encoder for encoding its transmission, said second receiver using at least one of a plurality of convolutional error correcting codes (ECC's) for decoding its reception, said method comprising:

establishing connection between said first and second transceivers;

said second receiver, based on predetermined criteria, selecting which one of said plurality of ECC's for data transmission is to be used by said first transmitter;

said second receiver communicating its selection of one of said plurality of ECC's by sending a corresponding set of parameters to said first transmitter;

said first transmitter inserting said parameters in its programmable encoder to generate said ECC to encode said digital data for transmission, and said second receiver decoding the encoded digital data based on said error correcting code selected.

9. A method according to claim 8, wherein said plurality of ECC's comprise trellis codes for V.32 and V.34 modems as specified by Recommendations V.32 and V.34 of the International Telecommunication Union-Telecommunication Standardization Sector ("ITU-TSS").

10. A method according to claim 8, wherein said second receiver selects one of said ECC's based on predetermined criteria comprising predetermined line characteristics of the connection between said first and second transceivers.

11. A method according to claim 8, wherein said corresponding set of parameters is contained in a binary matrix C of (s+2t) by (s+r), wherein "s" is such that $2^s$ is the number of states of the error correcting code which uses "s" binary state variables, "t" is the number of binary multiplies in the code implementation, "r" is the number of binary data inputs to the encoder, and the elements of C, indexed as "$c_{ij}$", are given by the formula describing transitions of state variables "$u_k$", as follows:

$$w_k(m) = \sum_{i=0}^{s+r-1} c_{ki} \cdot v_i(m), \text{ for } k = 0, 1, \ldots, s+2t-1$$

where:

$u_k(m + 1) =$ $$\begin{cases} w_k(m) + w_{s+2k}(m) \cdot w_{s+2k+1}(m) & \text{for } k = 0, 1, \ldots, t-1 \\ w_k(m) & \text{for } k = t, t+1, \ldots, s+2t-1 \end{cases}$$

$$C = \begin{bmatrix} c_{00} & c_{01} & \cdots & c_{0(s+r-1)} \\ c_{10} & & \cdot & \\ & & \cdot & \\ & & \cdot & \\ & & \cdot & \\ c_{(s+2t-1)0} & \cdots & & c_{(s+2t-1)(s+r-1)} \end{bmatrix}$$

$v(m) = [u_0(m), u_1(m), \ldots, u_{s-1}(m), y_1(m), y_2(m), \ldots, y_r(m)]^T$ such that these state transitions correspond to said method of implementation of the error correcting code.

* * * * *